(12) United States Patent
Jun

(10) Patent No.: US 12,289,557 B2
(45) Date of Patent: Apr. 29, 2025

(54) ANALOG-TO-DIGITAL CONVERTING CIRCUITS FOR DUAL CONVERSION GAIN OPERATION AND OPERATION METHODS OF THE SAME

(71) Applicant: SAMSUNG ELECTRONICS CO., LTD., Suwon-si (KR)

(72) Inventor: Jaehoon Jun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 206 days.

(21) Appl. No.: 18/329,322

(22) Filed: Jun. 5, 2023

(65) Prior Publication Data
US 2024/0147092 A1    May 2, 2024

(30) Foreign Application Priority Data

Oct. 26, 2022 (KR) .................. 10-2022-0139296

(51) Int. Cl.
*H04N 25/78* (2023.01)
*H03G 3/00* (2006.01)
(Continued)

(52) U.S. Cl.
CPC ............. *H04N 25/78* (2023.01); *H03G 3/00* (2013.01); *H03M 1/1205* (2013.01); *H03M 1/18* (2013.01); *H04N 25/709* (2023.01)

(58) Field of Classification Search
CPC .... H04N 25/709; H04N 25/75; H04N 25/772; H04N 25/778; H04N 25/78;
(Continued)

(56) References Cited

U.S. PATENT DOCUMENTS 7,994,464 B2    8/2011 Mckee
9,402,039 B2    7/2016 Solhusvik et al.
(Continued)

FOREIGN PATENT DOCUMENTS

KR    20210066048 A    6/2021

OTHER PUBLICATIONS

Vogelmann, Patrick, et al., "A 1.1mW 200kS/s Incremental ΔΣ ADC with a DR of 91.5dB Using Integrator Slicing for Dynamic Power Reduction", 2018 IEEE International Solid-State Circuits Conference (ISSCC), Feb. 11-15, 2018, pp. 236-238.

*Primary Examiner* — Lin Ye
*Assistant Examiner* — Chriss S Yoder, III
(74) *Attorney, Agent, or Firm* — Myers Bigel, P.A.

(57) ABSTRACT

Disclosed is an amplifier circuit including a first input terminal that receives a ramp signal, a second input terminal that receives a pixel signal, an output terminal that outputs an output signal, wherein the output signal is based on comparing the pixel signal and the ramp signal, a capacitor that is electrically connected between the output terminal and a ground terminal, a switch that is electrically connected with the capacitor, and a current source that outputs a power current. The pixel signal corresponds to a first conversion gain or a second conversion gain, and a value of the second conversion gain is higher than a value of the first conversion gain, and a bandwidth of the amplifier circuit is adjusted depending on whether the pixel signal corresponds to the first conversion gain or the second conversion gain.

20 Claims, 11 Drawing Sheets

(51) Int. Cl.
*H03M 1/12* (2006.01)
*H03M 1/18* (2006.01)
*H04N 25/709* (2023.01)

(58) Field of Classification Search
CPC ...... H03M 1/1205; H03M 1/123; H03M 1/18; H03M 1/56; H03G 3/00
See application file for complete search history.

(56) References Cited

U.S. PATENT DOCUMENTS

| | | | |
|---|---|---|---|
| 10,615,190 B2* | 4/2020 | Ebihara | H04N 25/75 |
| 2007/0035649 A1 | 2/2007 | McKee | |
| 2013/0270420 A1* | 10/2013 | Park | H04N 25/75 |
| | | | 250/208.1 |
| 2021/0160448 A1 | 5/2021 | Seo et al. | |

* cited by examiner

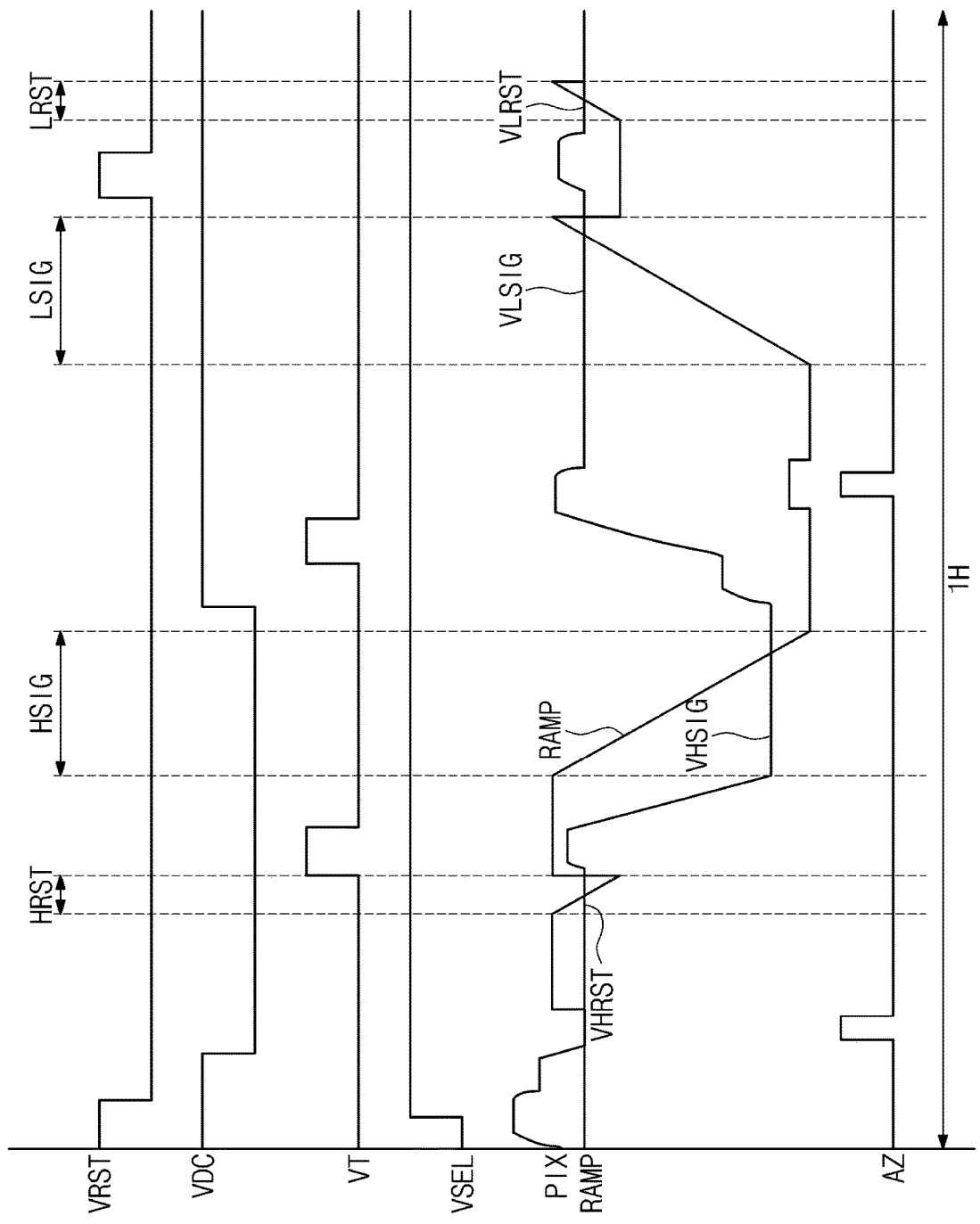

ANALOG-TO-DIGITAL CONVERTING CIRCUITS FOR DUAL CONVERSION GAIN OPERATION AND OPERATION METHODS OF THE SAME

CROSS-REFERENCE TO RELATED APPLICATIONS

This application claims priority under 35 U.S.C. § 119 to Korean Patent Application No. 10-2022-0139296 filed on Oct. 26, 2022, in the Korean Intellectual Property Office, the disclosures of which are incorporated by reference herein in their entireties.

BACKGROUND

Embodiments of the present disclosure described herein relate to analog-to-digital converters, and more particularly, relate to analog-to-digital converting circuits for optimizing dual conversion gain operation and operation methods of the same.

An image sensor may include, for example, a charge coupled device (CCD) image sensor, a complementary metal-oxide semiconductor (CMOS) image sensor (CIS), etc. A CMOS image sensor may include pixels including CMOS transistors and may convert light energy into an electrical signal by using a photoelectric conversion element (or device) included in each pixel. The CMOS image sensor may obtain information about a captured/photographed image by using the electrical signal generated by each pixel.

An analog-to-digital converter (ADC) may receive an analog input voltage and may convert the received analog input voltage to a digital signal. The converted digital signal may be provided to other devices. The ADC may be used in various signal processing devices. As the performance of signal processing devices is improved, nowadays, an improved resolution for an analog signal is required. As such, there is used an ADC capable of processing many signals at the same time or providing an improved resolution for each signal. However, such ADC may cause an increase of power consumption.

SUMMARY

Embodiments of the present disclosure provide analog-to-digital converting circuits for optimizing current consumption of dual conversion gain operations and time taken to perform the dual conversion gain operations, operation methods thereof, and image sensors including the same.

According to some embodiments, an amplifier circuit includes a first input terminal that receives a ramp signal, a second input terminal that receives a pixel signal, an output terminal that outputs an output signal, wherein the output signal is based on comparing the pixel signal and the ramp signal, a capacitor that is electrically connected between the output terminal and a ground terminal, a switch that is electrically connected with the capacitor, and a current source that outputs a power current. The pixel signal corresponds to a first conversion gain or a second conversion gain, and a value of the second conversion gain is higher than a value of the first conversion gain, and a bandwidth of the amplifier circuit is adjusted depending on whether the pixel signal corresponds to the first conversion gain or the second conversion gain.

According to some embodiments, an image sensor includes a pixel array including a plurality of pixels, wherein the pixel array is configured to output a first pixel signal that corresponds to a first conversion gain and a second pixel signal that corresponds to a second conversion gain from the plurality of pixels that share a floating diffusion region, a first plurality of analog-to-digital converting (ADC) circuits, wherein each of the first plurality of ADC circuits is configured to output a first digital signal based on the first pixel signal and a first ramp signal, and a second plurality of ADC circuits, wherein each of the second plurality of ADC circuits is configured to output a second digital signal based on the second pixel signal and a second ramp signal. A value of the second conversion gain is higher than a value of the first conversion gain. A first bandwidth of the first plurality of ADC circuits and a second bandwidth of the second plurality of ADC circuits are adjusted independently of each other.

According to some embodiments, an operation method of an analog-to-digital converting (ADC) circuit includes generating an output signal from an amplifier of the ADC circuit, wherein the output signal is based on a result of comparing a pixel signal and a ramp signal, adjusting a power current of the amplifier depending on a conversion gain of the pixel signal, and adjusting a bandwidth of the amplifier depending on the conversion gain of the pixel signal. The output signal is further based on the power current.

BRIEF DESCRIPTION OF THE FIGURES

The above and other objects and features of the present disclosure will be more clearly understood by describing the embodiments thereof in detail with reference to the accompanying drawings.

FIG. 4B is a circuit diagram illustrating a floating diffusion region under a low conversion gain condition in which a dual conversion transistor of FIG. 3 is turned on.

FIG. 8A is a timing diagram illustrating a process in which an ADC circuit of FIG. 5 processes a pixel signal depending on a reset-sig-sig-reset (RSSR) method.

DETAILED DESCRIPTION

Below, embodiments of the present disclosure will be described in detail and clearly to such an extent that one skilled in the art easily carries out the present disclosure.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof. The embodiments of the software and the hardware of the present disclosure are not limited thereto.

Figure 1:
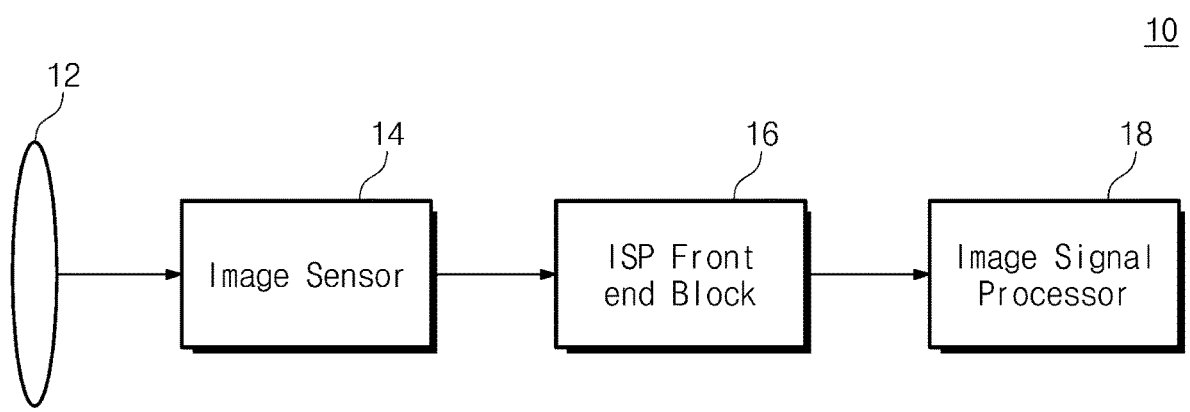
FIG. 1 illustrates an example of a configuration of an image processing block according to the embodiments of the present disclosure.

FIG. 1 illustrates an example of a configuration of an image processing block 10 according to the embodiments of the present disclosure. The image processing block 10 may be implemented as a part of various electronic devices such as a smartphone, a digital camera, a laptop computer, and a desktop computer, but is not limited thereto. The image processing block 10 may include a lens 12, an image sensor 14, an image signal processor (ISP) front end block 16, and an image signal processor 18.

Light may be reflected by an object, a scenery, etc. targeted for photographing, and the lens 12 may receive the reflected light. The image sensor 14 may generate an electrical signal based on the reflected light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert light into electrical signals to generate pixel values. A ratio at which light is converted into an electrical signal (e.g., a voltage) may be defined as "conversion gain". In particular, the pixel array may generate pixel signals under a low conversion gain condition and a high conversion gain condition, by using a change of the conversion gain, that is, a dual conversion gain.

In addition, the image sensor 14 may include an analog-to-digital converting (ADC) circuit for performing a correlated double sampling (CDS) operation on the pixel values. A configuration of the image sensor 14 will be described in detail with reference to FIG. 2.

The ISP front end block 16 may perform pre-processing on an electrical signal output from the image sensor 14 so as to be appropriate for processing of the image signal processor 18. Also, the ISP front end block 16 of the present disclosure may selectively perform the pre-processing for an electrical signal corresponding to the low conversion gain condition and pre-processing for an electrical signal corresponding to the high conversion gain condition, based on an output of the image sensor 14.

The image signal processor 18 may generate image data associated with the photographed object or scenery by appropriately processing the electrical signal processed by the ISP front end block 16. To this end, the image signal processor 18 may perform various processing operations such as color correction, auto white balance, gamma correction, color saturation correction, formatting, bad pixel correction, and hue correction.

One lens 12 and one image sensor 14 are illustrated in FIG. 1. However, in another embodiment, the image processing block 10 may include a plurality of lenses, a plurality of image sensors, and a plurality of ISP front end blocks. In this case, the plurality of lenses may have, for example, different fields of view. Also, the plurality of image sensors may have, for example, different functions, different performances, and/or different characteristics, and may respectively include pixel arrays of different configurations.

Figure 2:
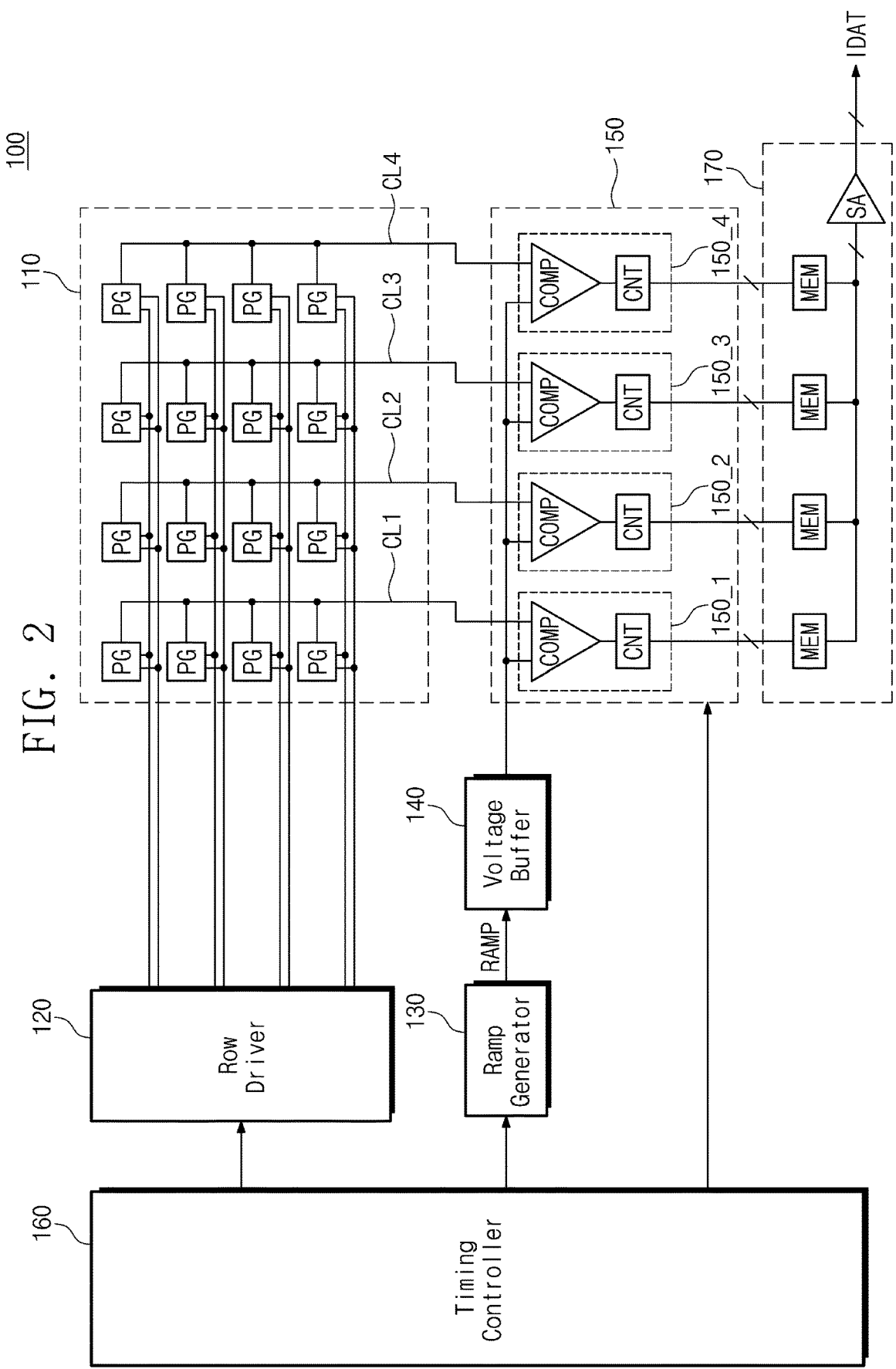
FIG. 2 illustrates an example of a configuration of an image sensor of FIG. 1.

FIG. 2 illustrates an example of a configuration of the image sensor 14 of FIG. 1. An image sensor 100 may include a pixel array 110, a row driver 120, a ramp signal generator 130, a voltage buffer 140, an ADC block 150, a timing controller 160, and a buffer 170.

The pixel array 110 may include a plurality of pixels arranged in the form of a matrix, that is, arranged along rows and columns. Each of the plurality of pixels may include a photoelectric conversion element (or device). For example, the photoelectric conversion element may include a photo diode, a photo transistor, a photo gate, a pinned photo diode, or the like.

The pixel array 110 may include a plurality of pixel groups PG. Each pixel group PG may include two or more pixels, that is, a plurality of pixels. The plurality of pixels of the pixel group PG may share one floating diffusion region or a plurality of floating diffusion regions. An example in which the pixel array 110 includes the pixel groups PG arranged in the form of a matrix with four rows and four columns (i.e., includes 4×4 pixel groups PG) is illustrated in FIG. 2. However, the present disclosure is not limited thereto.

The pixel group PG may include pixels of the same color. For example, the pixel group PG may include a red pixel to convert light of a red spectrum into an electrical signal, a green pixel to convert light of a green spectrum into an electrical signal, or a blue pixel to convert light of a blue spectrum into an electrical signal. For example, the pixels of the pixel array 110 may be arranged in the form of a tetra-Bayer pattern.

The pixels of the pixel array 110 may output pixel signals through column lines CL1 to CL4, depending on the intensity or the amount of light received from the outside. For example, the pixel signals may be analog signals corresponding to the intensity or the amount of light received from the outside.

As described with reference to FIG. 1, the pixel array 110 may generate pixel signals under the low conversion gain condition and the high conversion gain condition depending on ambient luminance of an object. Below, a pixel signal generated under the low conversion gain condition is referred to as a "low conversion gain pixel signal", and a pixel signal generated under the high conversion gain condition is referred to as a "high conversion gain pixel signal". The pixel signals may pass through voltage buffers (e.g., source followers) and may then be provided to the ADC block 150 through the column lines CL1 to CL4. The pixel array 110 may change the conversion gain by turning on or turning off a dual conversion transistor, which will be described in detail with reference to FIGS. 3, 4A, and 4B.

The row driver 120 may select and drive a row of the pixel array 110. The row driver 120 may decode an address and/or a control signal generated by the timing controller 160 and may generate control signals for selecting and driving a row of the pixel array 110. For example, the control signals may include a signal for selecting a pixel, a signal for resetting a floating diffusion region, and/or etc.

The ramp signal generator 130 may generate a ramp signal RAMP under control of the timing controller 160. For example, the ramp signal generator 130 may operate in response to a control signal such as a ramp enable signal. When the ramp enable signal is activated, the ramp signal generator 130 may generate the ramp signal RAMP depending on preset values (e.g., a start level, an end level, and a slope). In other words, the ramp signal RAMP may be a signal that increases or decreases along a preset slope during a specific time period. The ramp signal RAMP may be provided to the ADC block 150 through the voltage buffer 140.

The ADC block 150 may receive the pixel signals from the plurality of pixels through the column lines CL1 to CL4 and may receive the ramp signal RAMP from the ramp signal generator 130 through the voltage buffer 140. The ADC block 150 may operate based on a correlated double sampling (CDS) technique for obtaining a reset signal and an image signal from the received pixel signals and extracting a difference between the reset signal and the image signal as an effective signal component. The ADC block 150 may include a plurality of ADC circuits (e.g., 150_1 to 150_4), each of which includes a comparator COMP and a counter CNT.

Also, each of the plurality of ADC circuits may operate with respect to a low conversion gain pixel signal or operate with respect to a high conversion gain pixel signal. For example, half (e.g., 150_1 and 150_3) of the plurality of ADC circuits included in the ADC block 150 may operate with respect to the low conversion gain pixel signal, and the other half (e.g., 150_2 and 150_4) thereof may operate with respect to the high conversion gain pixel signal. However, the embodiment of the operation of the plurality of ADC circuits is not limited thereto.

In detail, each of the comparators COMP may perform the correlated double sampling (CDS) by comparing the reset signal of the pixel signal and the ramp signal RAMP and comparing the image signal of the pixel signal and the ramp signal RAMP. Each of the counters CNT may count pulses of the signal experiencing the correlated double sampling and may output a counting result as a digital signal. Also, the ADC block 150 of the present disclosure may adjust current consumption when performing the comparison operation or may adjust a bandwidth of the comparators COMP. The terms "adjust", "adjusted", "adjusting", and "adjustment" may respectively refer to "control", "controlled", "controlling", and "control" hereinafter.

The timing controller 160 may generate a control signal and/or a clock for controlling an operation and/or a timing of each of the row driver 120, the ramp signal generator 130, and the ADC block 150.

The buffer 170 may include memories MEMs and a sense amplifier SA. The memories MEM may store digital signals output from the corresponding counters CNT of the ADC block 150. The sense amplifier SA may sense and amplify the digital signals stored in the memories MEMs. The sense amplifier SA may output the amplified digital signals as image data IDAT, and the image data IDAT may be provided to the ISP front end block 16 of FIG. 1.

Figure 3:
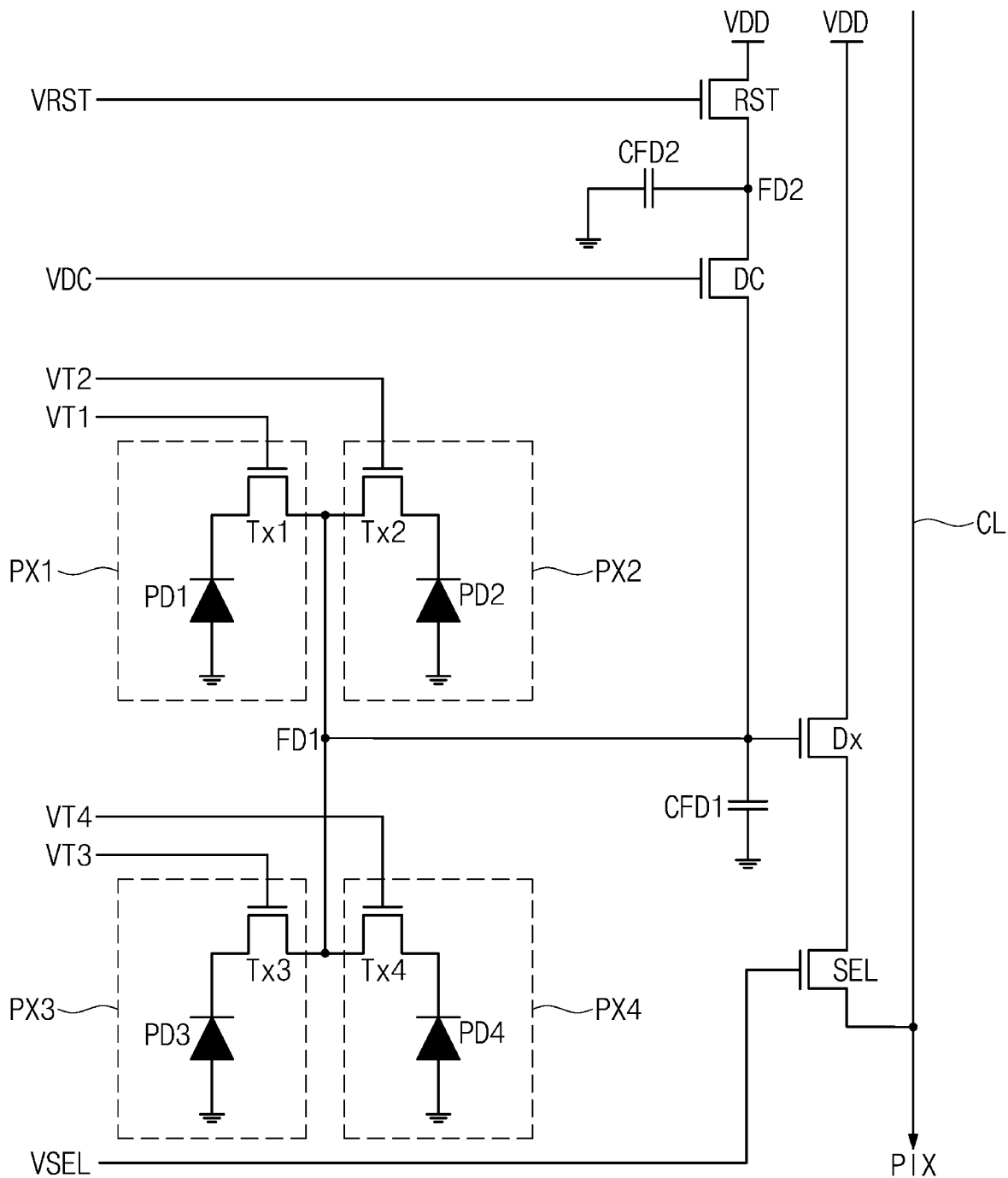
FIG. 3 is a circuit diagram illustrating an example of one among pixel groups of a pixel array of FIG. 2.
Figure 4A:
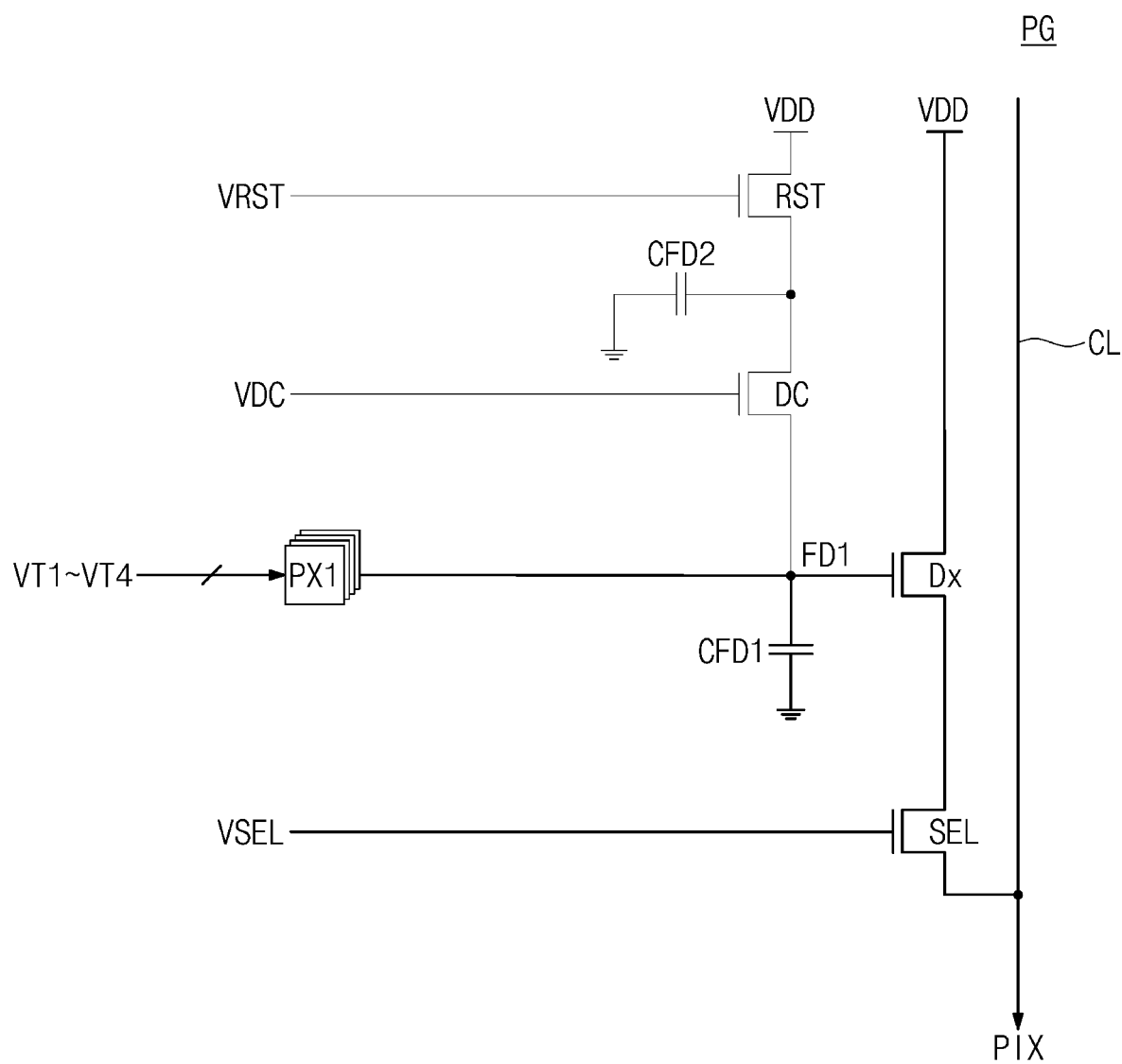
FIG. 4A is a circuit diagram illustrating a floating diffusion region under a high conversion gain condition in which a dual conversion transistor of FIG. 3 is turned off.
Figure 4B:
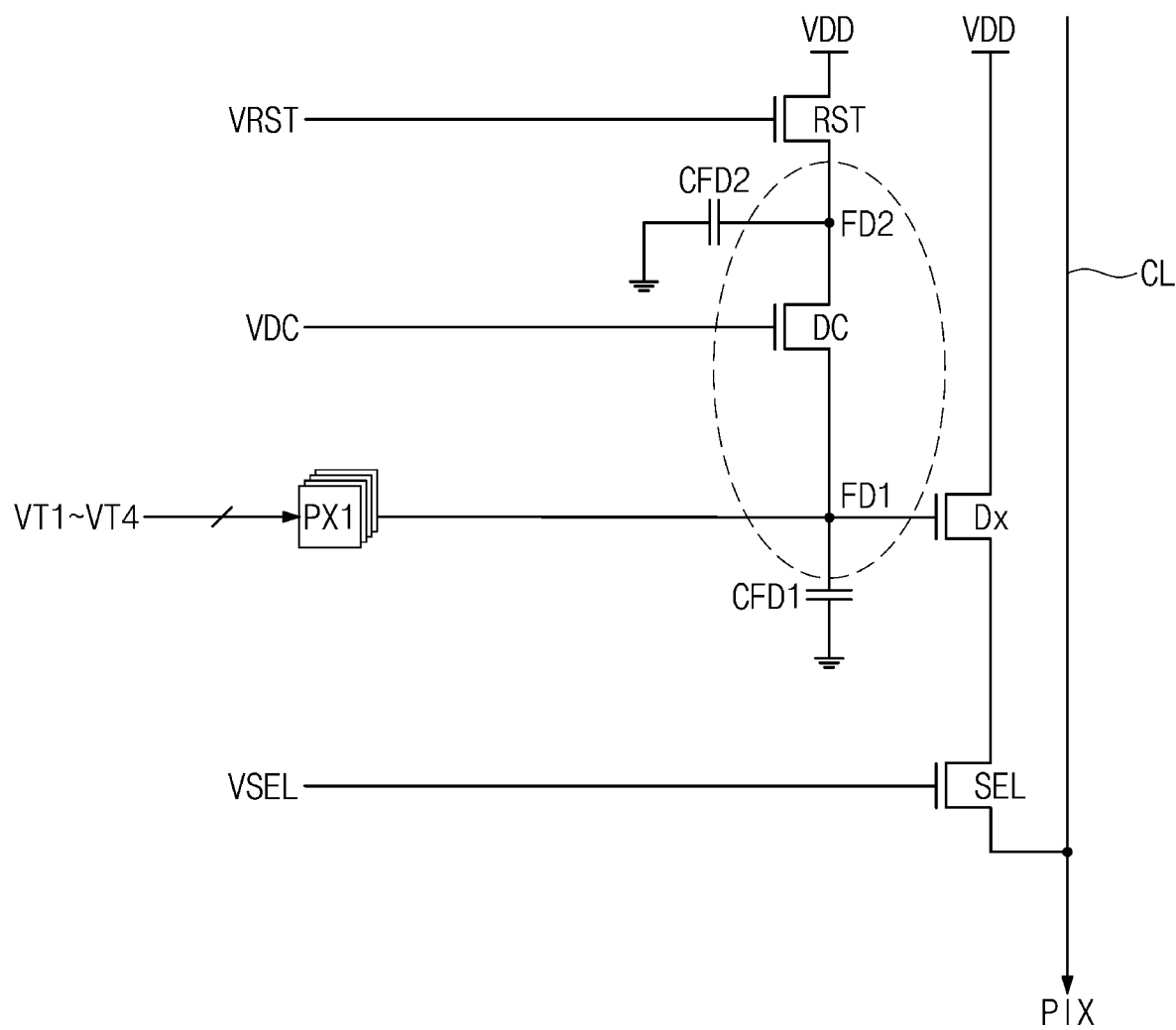

FIG. 3 is a circuit diagram illustrating an example of one of the pixel groups PG of the pixel array 110 of FIG. 2. FIG. 4A is a circuit diagram illustrating a floating diffusion region (e.g., first floating diffusion region FD1) under a high conversion gain condition in which a dual conversion transistor DC of FIG. 3 is turned off. FIG. 4B is a circuit diagram illustrating floating diffusion regions (e.g., first and second floating diffusion regions FD1 and FD2) under a low conversion gain condition in which the dual conversion transistor DC of FIG. 3 is turned on.

For example, the pixel group PG may include first to fourth pixels PX1 to PX4, first to fourth photoelectric conversion elements PD1 to PD4, first to fourth transfer transistors Tx1 to Tx4, a reset transistor RST, the dual conversion transistor DC, a drive transistor Dx, and a select transistor SEL. An example in which the pixel group PG has a tetracell structure in which four pixels, the first to fourth pixels PX1 to PX4, respectively include the first to fourth photoelectric conversion elements PD1 to PD4 is illustrated in FIG. 3, but the present disclosure is not limited thereto. For example, the pixel group PG may be implemented to have various different structures.

The first pixel PX1 may include the first photoelectric conversion element PD1 and the first transfer transistor Tx1, and each of the other pixels PX2, PX3, and PX4 may also include similar components/elements such as the second to fourth photoelectric conversion elements PD2 to PD4 and the second to fourth transfer transistors Tx2 to Tx4. The first to fourth pixels PX1 to PX4 may share the reset transistor RST, the dual conversion transistor DC, the drive transistor Dx, and the select transistor SEL. Also, the first to fourth pixels PX1 to PX4 may share the first floating diffusion region FD1.

The first floating diffusion region FD1 or the second floating diffusion region FD2 may accumulate (or integrate) charges corresponding to the amount of incident light. While the transfer transistors Tx1 to Tx4 are respectively turned on by first to fourth transfer signals VT1 to VT4, the first floating diffusion region FD1 or the second floating diffusion region FD2 may accumulate (or integrate) charges supplied from the first to fourth photoelectric conversion elements PD1 to PD4. Because the first floating diffusion region FD1 may be electrically connected with a gate terminal of the drive transistor Dx operating as a source follower amplifier, a voltage corresponding to the charges accumulated at the first floating diffusion region FD1 may be formed. For example, a capacitance of the first floating diffusion region FD1 may be depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment (e.g., non-high-luminance environment), because the first floating diffusion region FD1 may not be easily saturated, there may be no need to increase the capacitance (i.e., CFD1) of the first floating diffusion region FD1. In this case, the dual conversion transistor DC may be turned off.

However, in a high-luminance environment, the first floating diffusion region FD1 may be saturated. To prevent the saturation, the dual conversion transistor DC may be turned on such that the first floating diffusion region FD1 and the second floating diffusion region FD2 are electrically connected. In this case, a capacitance of the first and second floating diffusion regions FD1 and FD2 may be increased to a sum of the first capacitance CFD1 and a second capacitance CFD2.

The first to fourth transfer transistors Tx1 to Tx4 may be respectively driven by the first to fourth transfer signals VT1 to VT4, and may transfer charges generated (or integrated) by the first to fourth photoelectric conversion elements PD1 to PD4 to the first floating diffusion region FD1 or the second floating diffusion region FD2. For example, first ends of the first to fourth transfer transistors Tx1 to Tx4 may be respectively electrically connected with the first to fourth photoelectric conversion elements PD1 to PD4, and second ends thereof may be electrically connected in common with the first floating diffusion region FD1.

The reset transistor RST may be driven by a reset signal VRST and may provide a power supply voltage VDD to the first floating diffusion region FD1 or the second floating diffusion region FD2. As such, the charges accumulated in the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 to generate a pixel signal PIX. The select transistor SEL may be driven by a selection signal VSEL and may select pixels to be read in units of row. When the select transistor SEL is turned on, the pixel signal PIX may output to the ADC block 150 of FIG. 2 through a column line CL.

Figure 5:
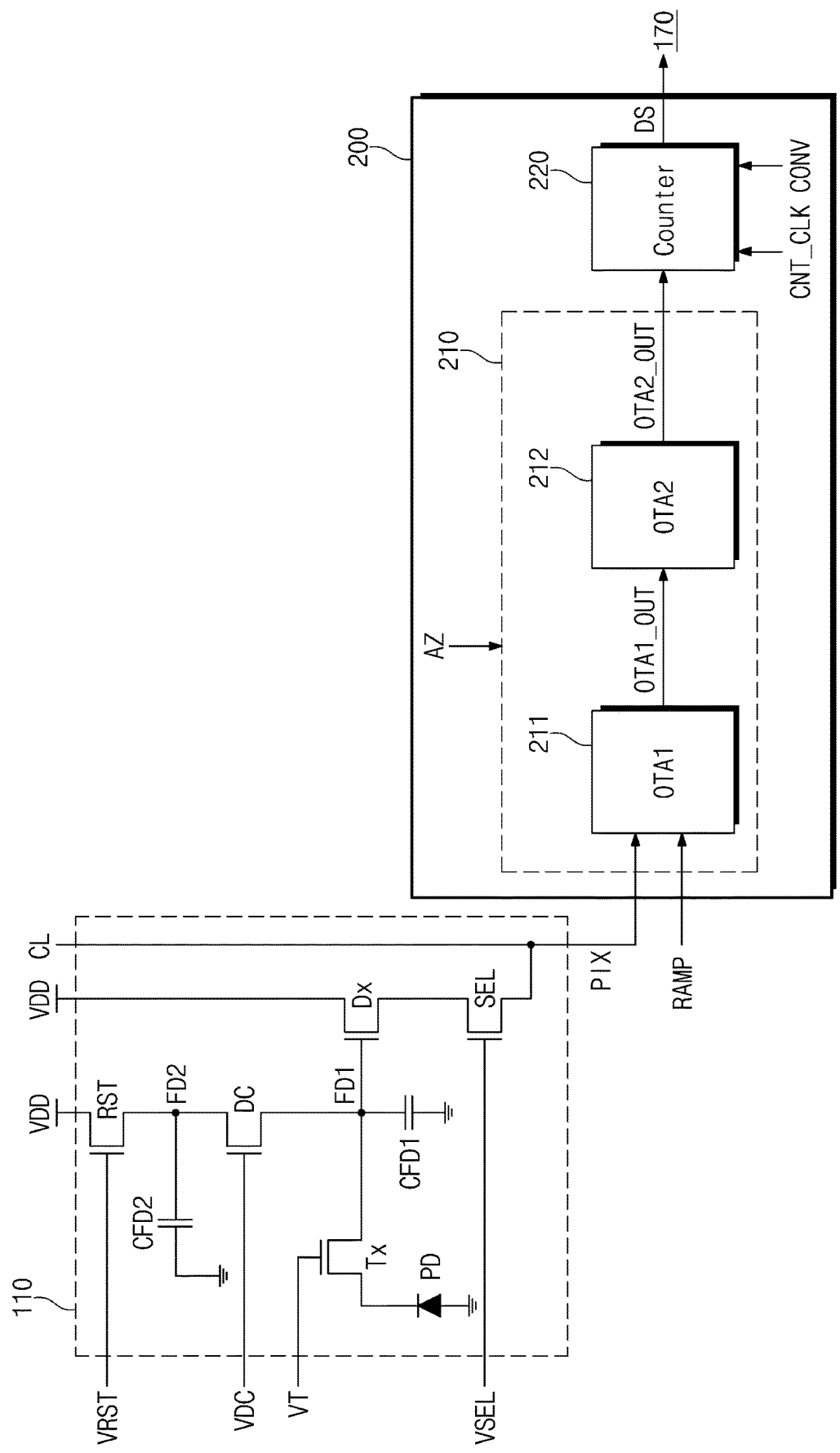
FIG. 5 is a circuit diagram illustrating an example of one of ADC circuits of FIG. 2.

FIG. 5 is a circuit diagram illustrating an example of one of the plurality of ADC circuits (e.g., 150_1 to 150_4) of FIG. 2. For clearness of description and brevity of drawing, an example in which the pixel array 110 includes only one pixel is illustrated in FIG. 5, and the configuration and function of the pixel array 110 are identical to those described with reference to FIGS. 3, 4A, and 4B. In addition, the number of pixels in the pixel array 110 is not limited thereto.

An ADC circuit 200 in FIG. 5 may correspond to one of the plurality of ADC circuits (e.g., 150_1 to 150_4) of FIG. 2. The ADC circuit 200 may include a comparator 210 and a counter 220. The ADC circuit 200 may convert the pixel signal PIX, an analog signal output from the pixel array 110, into a digital signal DS and output the digital signal DS. In detail, as described with reference to FIG. 2, the comparator 210 may perform correlated double sampling (CDS) by comparing the reset signal of the pixel signal PIX and the ramp signal RAMP and comparing the image signal of the pixel signal PIX and the ramp signal RAMP, and the counter 220 may count pulses of a signal experiencing the correlated double sampling (CDS) and may output a counting result as a digital signal. FIG. 5 will be described with reference to FIGS. 2, 3, 4A, and 4B.

For example, the comparator 210 may have a two-stage structure including two amplifiers (i.e., a first amplifier 211 and a second amplifier 212), and each of the first amplifier 211 and the second amplifier 212 may be implemented as an operational transconductance amplifier (OTA). However, the present disclosure is not limited thereto. For example, the comparator 210 may have a structure including more than two amplifiers.

The first amplifier 211 may receive the pixel signal PIX from the pixel array 110 through the column line CL, and may receive the ramp signal RAMP from the ramp signal generator 130 through the voltage buffer 140. The first amplifier 211 may output a first output signal OTA1_OUT based on the received signals. For example, in a period where the level of the ramp signal RAMP is higher than the level of the pixel signal PIX, the first amplifier 211 may output the first output signal OTA1_OUT having the high level; in a period where the level of the ramp signal RAMP is lower than the level of the pixel signal PIX, the first amplifier 211 may output the first output signal OTA1_OUT having the low level. Also, the comparison operation of the first amplifier 211 described above may be performed both when the reset signal of the pixel signal PIX and the ramp signal RAMP are compared and when the image signal of the pixel signal PIX and the ramp signal RAMP are compared. The term "level" may refer to "voltage level", the "voltage", or other parameters for the magnitude of a signal, such as "current level" or the "current" hereinafter.

The second amplifier 212 may amplify the first output signal OTA1_OUT and may output a second output signal OTA2_OUT being a comparison signal. For example, the second output signal OTA2_OUT may be an inverted version of the first output signal OTA1_OUT (or may be complementary to the first output signal OTA1_OUT). In other words, the second amplifier 212 may output the second output signal OTA2_OUT having the low level during the high level of the first output signal OTA1_OUT and may output the second output signal OTA2_OUT having the high level during the low level of the first output signal OTA1_OUT.

In the following description, the voltage level transitions of the first output signal OTA1_OUT or the second output signal OTA2_OUT from the high level to the low level or from the low level to the high level as the comparator 210 performs the comparison operation may be referred to as "decision of the ADC block 150". In other words, the expression "after the decision of the ADC block 150 ends" may mean "after the voltage level of the first output signal OTA1_OUT or the second output signal OTA2_OUT changes from the high level to the low level or from the low level to the high level". In an auto-zero period before the comparison operation is performed, the comparator 210 may be initialized in response to an auto-zero signal and may then again perform the comparison operation.

The counter 220 may operate under control of the timing controller 160, may count pulses of the second output signal OTA2_OUT, and may output the digital signal DS as a counting result. For example, the counter 220 may operate in response to control signals such as a counter clock signal CNT_CLK and an inversion signal CONV for inverting an internal bit of the counter 220.

For example, the counter 220 may include an up/down counter, a bit-wise inversion counter, etc. An operation of the bit-wise inversion counter may be similar to an operation of the up/down counter. For example, the bit-wise inversion counter may perform a function of performing up-counting only and a function of converting all internal bits of a counter to obtain the 1's complement when a specific signal is input thereto. The bit-wise inversion counter may perform a reset count operation and may then invert the result of the reset count operation so as to be converted into the 1's complement, that is, a negative value.

Through the above operation of the ADC circuit 200, a low conversion gain digital signal corresponding to a low conversion gain pixel signal and a high conversion gain digital signal corresponding to a high conversion gain pixel signal may be output, and the image data DAT may be generated based on the low conversion gain digital signal and the high conversion gain digital signal. The image data IDAT thus generated may correspond to a high dynamic range (HDR) image with a high dynamic range. The quality of the HDR image may be determined by a signal-to-noise ratio (SNR) of the image sensor 100.

The SNR may be affected by a magnitude of a signal and a magnitude of a noise; as the signal magnitude becomes greater and the noise magnitude becomes smaller, the SNR may become higher. For example, a noise that is capable of occurring in the process of generating an image may include a thermal noise, a flicker noise, a dark noise, a shot noise, a quantization error, a settling error, etc.

For example, the signal magnitude may vary depending on a level of a power current flowing to the first amplifier 211. As the signal magnitude increases (i.e., as the level of the power current flowing to the first amplifier 211 increases), the SNR may increase, and the power consumption of the ADC circuit 200 may increase; as the signal magnitude decreases (i.e., as the level of the power current flowing to the first amplifier 211 decreases), the SNR may decrease, and the power consumption of the ADC circuit 200 may decrease.

Within a range where the quality of image data is uniformly maintained without a great decrease in the SNR, the ADC circuit 200 may allow the level of the power current flowing to the first amplifier 211 to decrease. In particular, in the low conversion gain condition, the shot noise by the light may be the most important factor determining the SNR. In the low conversion gain condition, because the shot noise included in the SNR is great, even though the signal magnitude decreases, the SNR may not decrease significantly to such an extent as to influence the quality of image data. Accordingly, the amount of current consumed by the ADC circuit that performs the comparison operation on the low conversion gain pixel signal may be adjusted to be smaller than the amount of current consumed by the ADC circuit that performs the comparison operation on the high conversion gain pixel signal.

Next, the noise magnitude may vary depending on the bandwidth of the first amplifier 211. In detail, when the bandwidth of the first amplifier 211 decreases, a flicker noise and a thermal noise included in the output signal of the first amplifier 211 (e.g., first output signal OTA1_OUT) may decrease, but a settling time of the correlated double sampling operation may increase. The increase in the settling time may cause an increase of a settling error. Within a range where a speed of the comparison operation does not become greatly slow, the ADC circuit 200 may allow the bandwidth of the first amplifier 211 to decrease. In particular, because the speed of the comparison operation is not greatly important under the low conversion gain condition, the effect of the noise decrease through the decrease in the bandwidth may be more significant in terms of the quality of image data. Accordingly, the bandwidth of the amplifier that performs the comparison operation on the low conversion gain pixel signal may be adjusted to be smaller than the bandwidth of the amplifier that performs the comparison operation on the high conversion gain pixel signal.

That is, according to some embodiments of the present disclosure, the amount of current consumed by the ADC circuit (e.g., ADC circuit 200) that performs the comparison operation on the low conversion gain pixel signal (e.g., pixel signal PIX) and the bandwidth of the amplifier (e.g., first amplifier 211) that performs the comparison operation on the low conversion gain pixel signal may be adjusted independently from the amount of current consumed by the ADC circuit (e.g., ADC circuit 200) that performs the comparison operation on the high conversion gain pixel signal (e.g., pixel signal PIX) and the bandwidth of the amplifier (e.g., first amplifier 211) that performs the comparison operation on the high conversion gain pixel signal. As such, the dual conversion gain operation may be optimized, and the power consumption and the noise may decrease. The current consumption optimization operation and the bandwidth optimization operation will be described in detail with reference to FIGS. 6 and 7.

Figure 6:
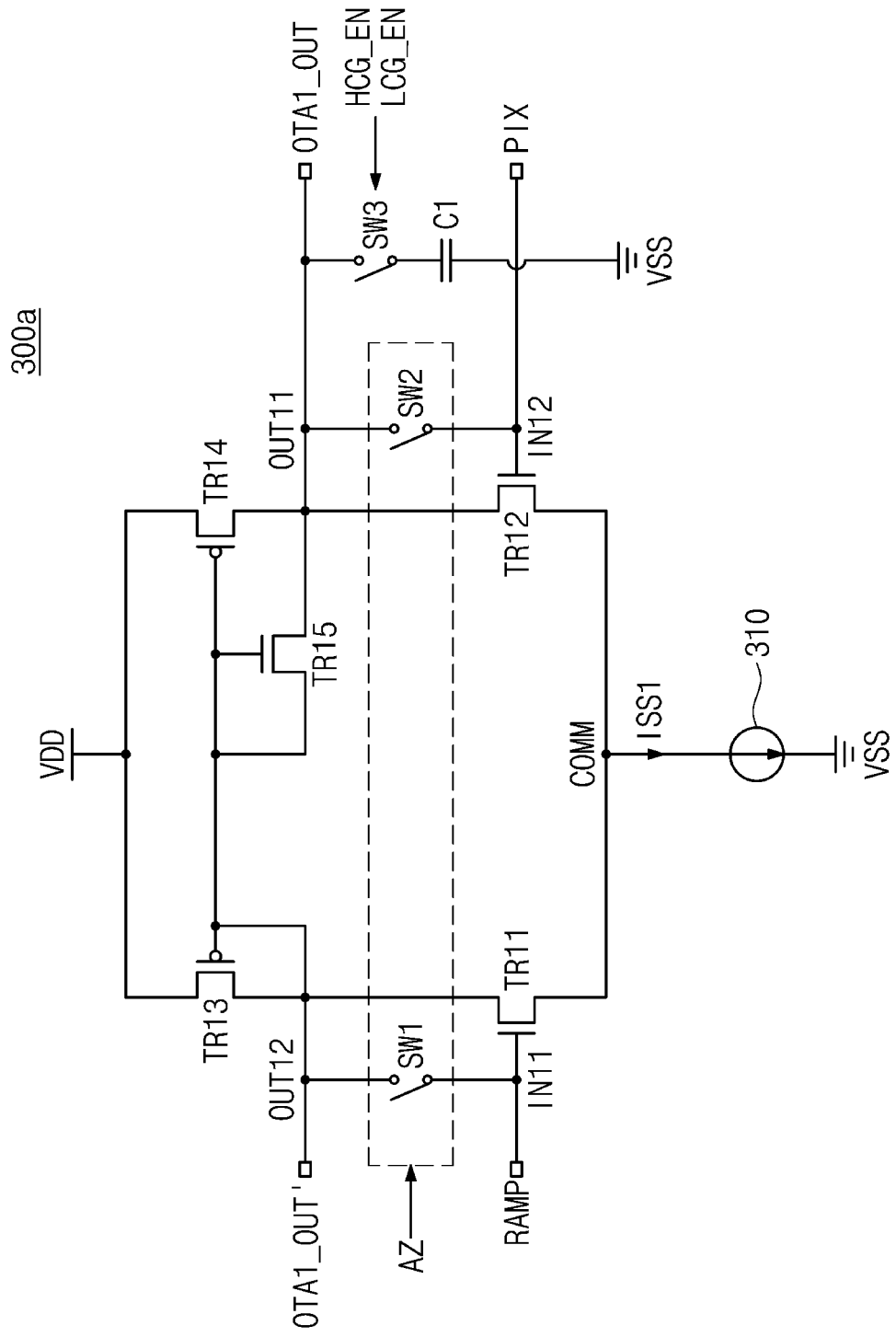
FIG. 6 is a circuit diagram illustrating an example of a first amplifier of FIG. 5.

FIG. 6 is a circuit diagram illustrating an example of the first amplifier 211 of FIG. 5. A first amplifier 300a, which is an example embodiment of the first amplifier 211 of FIG. 5, may include first to fifth transistors TR11 to TR15, a first current source 310 generating a power current ISS1, a capacitor C1 for adjusting the bandwidth of the first amplifier 300a, and first to third switches SW1 to SW3. For example, the first transistor TR11, the second transistor TR12, and the fifth transistor TR15 may be NMOS transistors, and the third transistor TR13 and the fourth transistor TR14 may be PMOS transistors. However, the present disclosure is not limited thereto. The first to fifth transistors TR11 to TR15 may be implemented with transistors whose types are different from those illustrated in FIG. 6. The numbers of transistors and switches are not limited thereto.

Referring to FIG. 6, the ramp signal RAMP may be input to a gate terminal (input terminal) of the first transistor TR11, and the pixel signal PIX may be input to a gate terminal (input terminal) of the second transistor TR12. Source terminals of the first and second transistors TR11 and TR12 may be electrically connected in common with the first current source 310. For example, the third and fourth transistors TR13 and TR14 may be electrically connected in the form of a current mirror. A sum of currents flowing to the first and second transistors TR11 and TR12 may be equal to the power current ISS1.

A gate terminal and a drain terminal of the third transistor TR13 and a drain terminal of the first transistor TR11 may be electrically connected in common with a second output node OUT12 (output terminal), and a drain terminal of the fourth transistor TR14 and a drain terminal of the second transistor TR12 may be electrically connected in common with a first output node OUT11 (output terminal). The fifth transistor TR15 may be electrically connected between the first and second output nodes OUT11 and OUT12. For example, the fifth transistor TR15 may limit a voltage level of a signal that is output from the first output node OUT11.

The first output signal OTA1_OUT may be output from the first output node OUT11, and a first complementary output signal OTA1_OUT' may be output from the second output node OUT12. For example, in a period where the level of the ramp signal RAMP is higher than the level of the pixel signal PIX, the first output signal OTA1_OUT may have the high level; in a period where the level of the ramp signal RAMP is lower than the level of the pixel signal PIX, the first output signal OTA1_OUT may have the low level. The first output signal OTA1_OUT may be provided to the second amplifier 212 of FIG. 5.

During the auto-zero period, the switches SW1 and SW2 may be turned on in response to an auto zero signal AZ. When the switches SW1 and SW2 are turned on, a second input node IN12 and the first output node OUT11 may be electrically connected with each other, and a first input node IN11 and the second output node OUT12 may be electrically connected with each other. Accordingly, during the auto-zero period, the voltage levels of the first input node IN11, the second input node IN12, the first output node OUT11, and the second output node OUT12 may be equalized.

The third switch SW3 and the capacitor C1 may be electrically connected between the first output node OUT11 and a ground terminal VSS. When the third switch SW3 is turned on, the capacitor C1 may decrease the bandwidth of the first amplifier 300a. In the case where the first amplifier 300a is included in the ADC circuit that performs the comparison operation on the low conversion gain pixel signal, the third switch SW3 may be turned on or turned off in response to a low conversion gain enable signal LCG_EN; in the case where the first amplifier 300a is included in the ADC circuit that performs the comparison operation on the high conversion gain pixel signal, the third switch SW3 may be turned on or turned off in response to a high conversion gain enable signal HCG_EN. For example, the low conversion gain enable signal LCG_EN and the high conversion gain enable signal HCG_EN may be generated and provided to the first amplifier 300a by the timing controller 160 of FIG. 2. A time period where the low conversion gain enable signal LCG_EN is maintained at a high signal level may be different from a time period where the high conversion gain enable signal HCG_EN is maintained at a high signal level. As described herein, a high signal level and a low signal level may be opposite states from one another. For example, high signal level may correspond to a high voltage level or an active state and a low signal level may correspond to a low voltage level or an inactive state. In some embodiments, a high signal level may correspond to an inactive state and a low signal level may correspond to an active state.

When the bandwidth of the first amplifier 300a is limited by the capacitor C1, the noise included in the first output signal OTA1_OUT may decrease, but a speed of the comparison operation may also relatively decrease. For example, through the above operations, the bandwidth of the amplifier (e.g., first amplifier 300a) that performs the comparison operation on the low conversion gain pixel signal (pixel signal PIX) may be adjusted to be different (e.g., smaller) than the bandwidth of the amplifier that performs the comparison operation on the high conversion gain pixel signal. For example, the bandwidth of the amplifier may increase when the conversion gain of the pixel signal increases. As such, the bandwidth of the first amplifier 300a may be optimized, and the noise caused by the dual conversion gain operation may decrease.

For example, the first amplifier 300a may be included in an ADC circuit performing a comparison operation on a high conversion gain pixel signal. In this case, the high conversion gain enable signal HCG_EN may be at a low signal level while the comparison operation is performed. Accordingly, while the comparison operation is being performed, the third switch SW3 may be turned off and the capacitor C1 may not reduce the bandwidth of the first amplifier 300a.

For example, the first amplifier 300a may be included in an ADC circuit performing a comparison operation on a low conversion gain pixel signal. In this case, the low conversion gain enable signal LCG_EN may be at a high signal level while the comparison operation is performed. Accordingly, while the comparison operation is being performed, the third switch SW3 may be turned on and the capacitor C1 may reduce the bandwidth of the first amplifier 300a.

Figure 7:
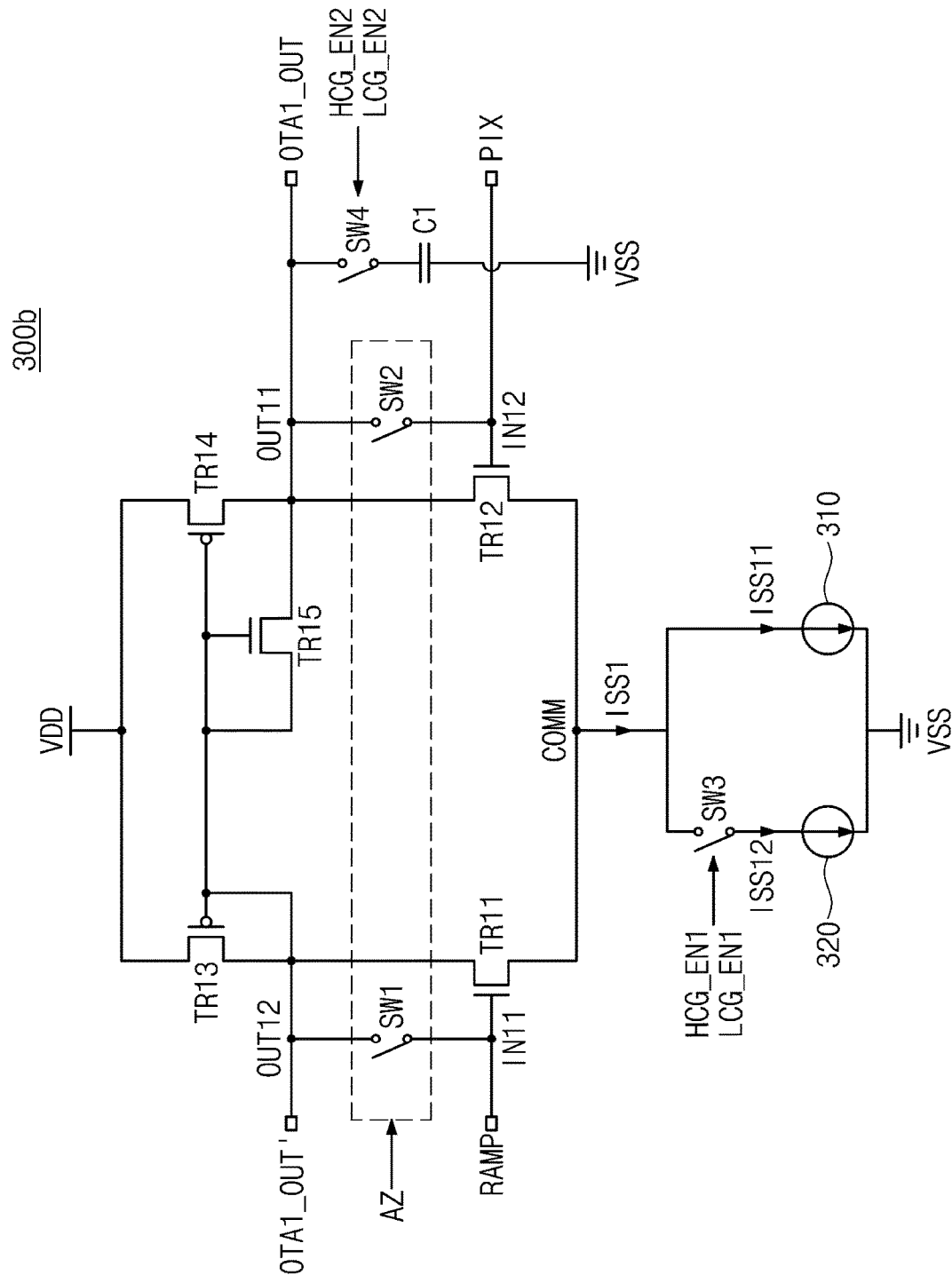
FIG. 7 is a circuit diagram illustrating another example of a first amplifier of FIG. 5.

FIG. 7 is a circuit diagram illustrating another example of the first amplifier 211 of FIG. 5. A first amplifier 300b, which is an example embodiment of the first amplifier 211 of FIG. 5, may include first to fifth transistors TR11 to TR15, a first current source 310 generating a first sub-power current ISS11, a second current source 320 generating a second sub-power current ISS12, a capacitor C1 for adjusting the bandwidth of the first amplifier 300b, and first to fourth switches SW1 to SW4. A configuration and an operation of the first amplifier 300b may be similar or identical to the configuration and the operation of the first amplifier 300a of FIG. 6 except for operations of the first current source 310, the second current source 320, and the third switch SW3, and thus, repetitive descriptions will be omitted to avoid redundancy.

The first current source 310 may output the first sub-power current ISS11. The second current source 320 may output the second sub-power current ISS12 when the third switch SW3 is turned on and may not operate when the third switch SW3 is turned off. That is, when the third switch SW3 is turned on, the power current ISS1 may be equal to a sum of the first sub-power current ISS11 and the second sub-power current ISS12; when the third switch SW3 is turned off, the power current ISS1 may be equal to the first sub-power current ISS11.

In detail, in the case where the first amplifier 300b is included in the ADC circuit (e.g., ADC circuit 200 of FIG. 5) that performs the comparison operation on the low conversion gain pixel signal (e.g., pixel signal PIX of FIG. 5), the third switch SW3 may be turned on or turned off in response to a first low conversion gain enable signal LCG_EN1; in the case where the first amplifier 300b is included in the ADC circuit (e.g., ADC circuit 200 of FIG. 5) that performs the comparison operation on the high conversion gain pixel signal (e.g., pixel signal PIX of FIG. 5), the third switch SW3 may be turned on or turned off in response to a first high conversion gain enable signal HCG_EN1. For example, the first low conversion gain enable signal LCG_EN1 and the first high conversion gain enable signal HCG_EN1 may be generated and provided to the first amplifier 300b by the timing controller 160 of FIG. 2.

For example, when the third switch SW3 is turned off, only the first current source 310 may operate; in this case, the power current ISS1 may be equal to the first sub-power current ISS11. In contrast, when the third switch SW3 is turned on, both the first current source 310 and the second current source 320 may operate; in this case, the power current ISS1 may be equal to the sum of the first sub-power current ISS11 and the second sub-power current ISS12.

For example, when the first amplifier 300b is included in an ADC circuit that performs a comparison operation on a low conversion gain pixel signal, while the comparison operation is performed, the third switch may be turned off in response to the first low conversion gain enable signal LCG_EN1 at a low signal level. Accordingly, the power supply current ISS1 may be equal to the first sub power supply current ISS11. On the other hand, when the first amplifier 300b is included in the ADC circuit performing the comparison operation on the low conversion gain pixel signal, while the comparison operation is performed, the third switch may be turned on in response to the first high conversion gain enable signal HCG_EN1 at a high signal level. Accordingly, the power supply current ISS1 may be equal to the sum of the first sub power supply current ISS11 and the second sub power supply current ISS12.

A time period where the first low conversion gain enable signal LCG_EN1 is maintained at the high signal level may be different from a time period where the first high conversion gain enable signal HCG_EN1 is maintained at the high signal level. For example, through the above operations of the first amplifier 300b, the amount of current consumed by the ADC circuit (e.g., ADC circuit 200 of FIG. 5) that performs the comparison operation on the low conversion gain pixel signal may be adjusted to be different (e.g., smaller) than the amount of current consumed by the ADC circuit (e.g., ADC circuit 200 of FIG. 5) that performs the comparison operation on the high conversion gain pixel signal. For example, a ratio of the first sub-power current ISS11 and the second sub-power current ISS12 when the comparison operation is performed on the low conversion gain pixel signal and a ratio of the first sub-power current ISS11 and the second sub-power current ISS12 when the comparison operation is performed on the high conversion gain pixel signal may be respectively optimized in the process of designing the first amplifier 300b. As such, the current consumption of the first amplifier 300b may be optimized, and the power consumption of the dual conversion gain operation may decrease.

In other words, referring to FIG. 7, the current consumption optimization operation may be performed by the operations of the third switch SW3 operating in response to the first low and high conversion gain enable signals LCG_EN1 and HCG_EN1, the first current source 310, and the second current source 320, and the bandwidth optimization operation described with reference to FIG. 6 may be performed by the operations of the fourth switch SW4 operating in response to second low and high conversion gain enable signals LCG_EN2 and HCG_EN2 and the capacitor C1. That is, the first amplifier 300*b* of FIG. 7 may perform both the current consumption optimization operation and the bandwidth optimization operation.

Meanwhile, embodiments in which the power current or the bandwidth of the first amplifier 211 of FIG. 5 is adjusted while the comparison operation is performed are described with reference to FIGS. 6 and 7, but the present disclosure is not limited thereto. For example, the power current or the bandwidth of the first amplifier 211 may be adjusted in a method that is different from that described with reference to FIGS. 6 and 7. Also, a power current or a bandwidth of the second amplifier 212 of FIG. 5 may be adjusted.

Figure 8B:
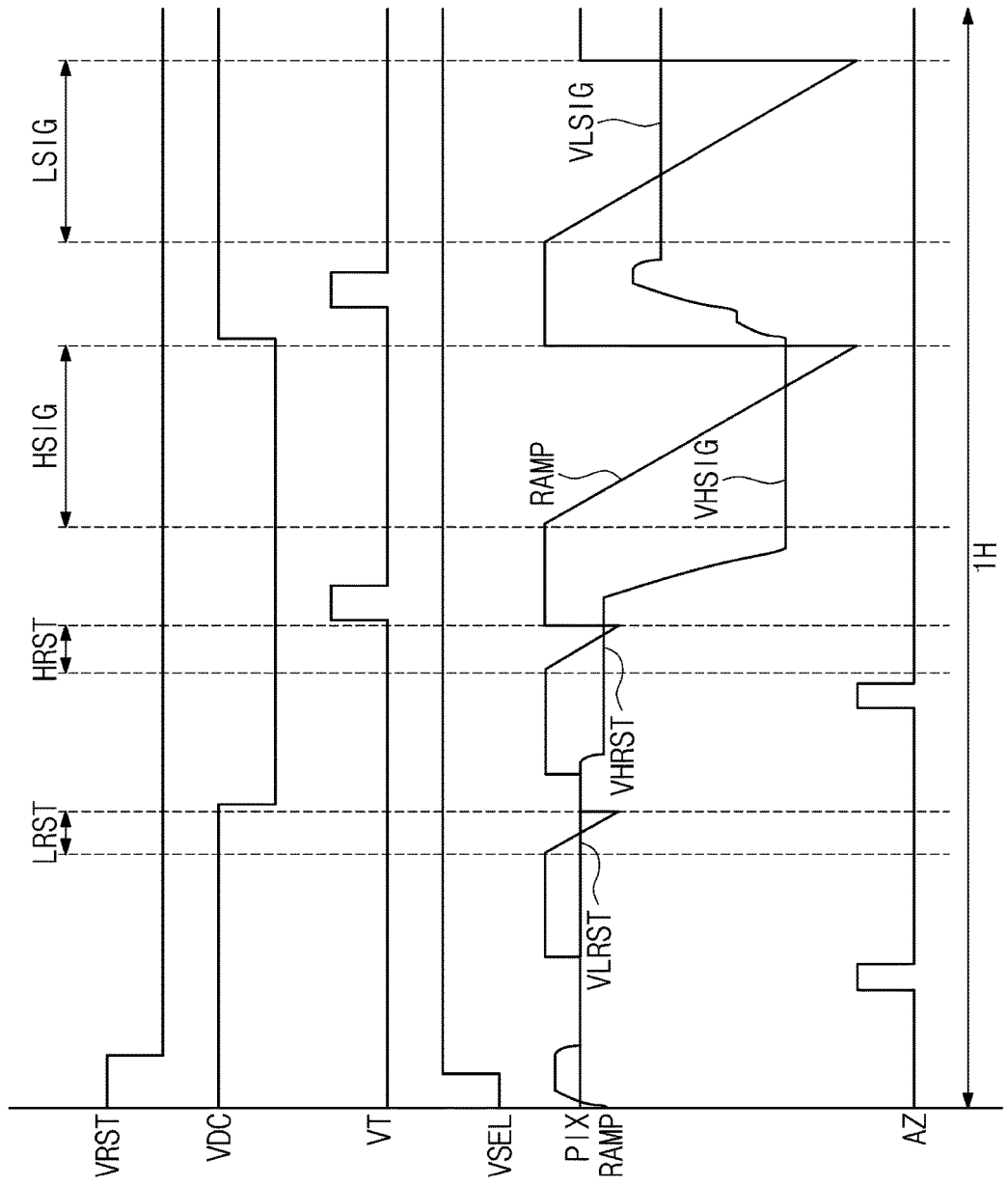
FIG. 8B is a timing diagram illustrating a process in which an ADC circuit of FIG. 5 processes a pixel signal depending on a reset-reset-sig-sig (RRSS) method.

FIG. 8A is a timing diagram illustrating a process in which the ADC circuit 200 of FIG. 5 processes the pixel signal PIX depending on a reset-sig-sig-reset (RSSR) method, and FIG. 8B is a timing diagram illustrating a process in which the ADC circuit 200 of FIG. 5 processes the pixel signal PIX depending on a reset-reset-sig-sig (RRSS) method. Below, FIGS. 8A and 8B will be described together with FIG. 5.

A 1H time period is illustrated in FIGS. 8A and 8B. The 1H time period may refer to a time period that should be essentially assured to drive the plurality of pixels of the pixel array 110 in units of row. For example, the 1H time period may include a high conversion gain reset signal period HRST, a high conversion gain image signal period HSIG, a low conversion gain reset signal period LRST, and a low conversion gain image signal period LSIG.

Referring to FIG. 8A, the high conversion gain reset signal period HRST, the high conversion gain image signal period HSIG, the low conversion gain image signal period LSIG, and the low conversion gain reset signal period LRST may progress sequentially (Reset-Sig-Sig-Reset: RSSR).

A high conversion gain reset signal VHRST, a high conversion gain image signal VHSIG, a low conversion gain image signal VLSIG, and a low conversion gain reset signal VLRST may be respectively output in a plurality of periods HRST, HSIG, LSIG, and LRST as components of the pixel signal PIX, so as to be sequentially converted into digital signals.

First, the reset signal VRST of the logic high level is applied to the gate of the reset transistor RST, and the reset signal VRST of the logic low level is then applied to the gate of the reset transistor RST. Next, the adjustment between the voltage level of the ramp signal RAMP and the voltage level of the pixel signal PIX may be made in response to the auto zero signal AZ. Then, the dual conversion signal VDC of the logic low level may be applied to the gate of the dual conversion transistor DC, and thus, the high conversion gain reset signal VHRST may be output in the high conversion gain reset signal period HRST. Afterwards, the transfer signal VT of the logic high level may be applied to the gate of the transfer transistor Tx, and thus, the high conversion gain image signal VHSIG may be output in the high conversion gain image signal period HSIG.

Next, the adjustment between the voltage level of the ramp signal RAMP and the voltage level of the pixel signal PIX may be again made in response to the auto zero signal AZ. As the reset signal VRST of the logic low level is applied to the gate of the reset transistor RST, the dual conversion signal VDC of the logic high level is applied to the gate of the dual conversion transistor DC, and the transfer signal VT of the logic high level is applied to the gate of the transfer transistor Tx, the low conversion gain image signal VLSIG may be output in the low conversion gain image signal period LSIG. Afterwards, the reset signal VRST of the logic high level may be applied to the gate of the reset transistor RST, and thus, the low conversion gain reset signal VLRST may be output in the low conversion gain reset signal period LRST.

Referring to FIG. 8B, the low conversion gain reset signal period LRST, the high conversion gain reset signal period HRST, high conversion gain image signal period HSIG, and the low conversion gain image signal period LSIG may progress sequentially (Reset-Reset-Sig-Sig: RRSS).

First, the reset signal VRST of the logic high level is applied to the gate of the reset transistor RST, and the reset signal VRST of the logic low level is then applied to the gate of the reset transistor RST. Next, the adjustment between the voltage level of the ramp signal RAMP and the voltage level of the pixel signal PIX may be made in response to the auto zero signal AZ. Then, the dual conversion signal VDC of the logic high level may be applied to the gate of the dual conversion transistor DC, and thus, the low conversion gain reset signal VLRST may be output in the low conversion gain reset signal period LRST. After the adjustment between the voltage level of the ramp signal RAMP and the voltage level of the pixel signal PIX is again made in response to the auto zero signal AZ, the dual conversion signal VDC of the logic low level may be applied to the gate of the dual conversion transistor DC, and thus, the high conversion gain reset signal VHRST may be output in the high conversion gain reset signal period HRST.

Afterwards, the transfer signal VT of the logic high level may be applied to the gate of the transfer transistor Tx, and thus, the high conversion gain image signal VHSIG may be output in the high conversion gain image signal period HSIG. As the dual conversion signal VDC of the logic high level is applied to the gate of the dual conversion transistor DC and the transfer signal VT of the logic high level is applied to the gate of the transfer transistor Tx, the low conversion gain image signal VLSIG may be output in the low conversion gain image signal period LSIG.

Figure 9:
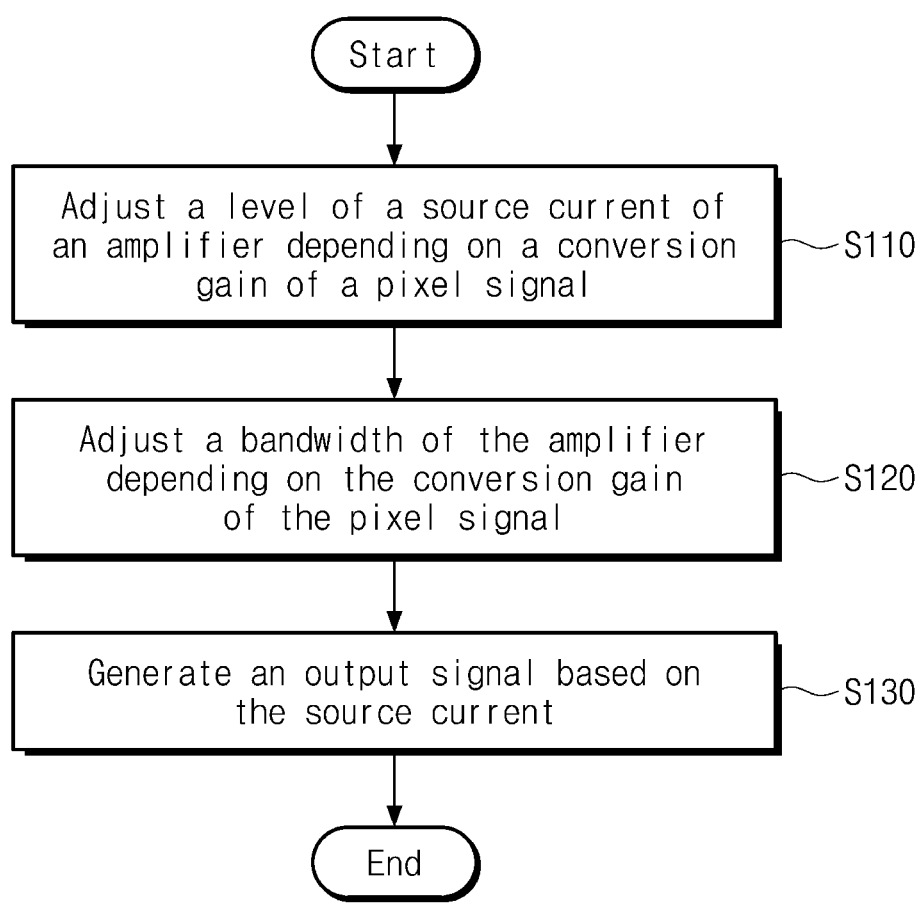
FIG. 9 is a flowchart illustrating an operation method of an analog-to-digital converting (ADC) circuit for optimizing a dual conversion gain operation according to the embodiments of the present disclosure.

FIG. 9 is a flowchart illustrating an operation method of an analog-to-digital converting (ADC) circuit for optimizing a dual conversion gain operation according to some embodiments of the present disclosure. Below, the description will be given with reference to FIGS. 7 and 9 together.

In operation S110, the first amplifier 300*b* may adjust the level of the power current ISS1 depending on a conversion gain of the pixel signal PIX. In detail, referring to FIG. 7, the first amplifier 300*b* may adjust the level of the power current ISS1 based on the first sub-power current ISS11 and the second sub-power current ISS12 by turning on or turning off the third switch SW3. When the pixel signal PIX corresponds to the high conversion gain, the third switch SW3 may be turned on or turned off in response to the first high conversion gain enable signal HCG_EN1; when the pixel signal PIX corresponds to the low conversion gain, the third switch SW3 may be turned on or turned off in response to the first low conversion gain enable signal LCG_EN1. For example, the level of the power current ISS1 may increase when the conversion gain of the pixel signal PIX increases.

In operation S120, the first amplifier 300*b* may adjust the bandwidth of the first amplifier 300*b* depending on the conversion gain of the pixel signal PIX. In detail, referring to FIG. 7, the first amplifier 300*b* may adjust the bandwidth of the first amplifier 300b through the capacitor C1 by turning on or turning off the fourth switch SW4. For example, when the fourth switch SW4 is turned on, the capacitor C1 may decrease the bandwidth of the first amplifier 300b. When the pixel signal PIX corresponds to the high conversion gain, the fourth switch SW4 may be turned on or turned off in response to the second high conversion gain enable signal HCG_EN2; when the pixel signal PIX corresponds to the low conversion gain, the fourth switch SW4 may be turned on or turned off in response to the second low conversion gain enable signal LCG_EN2.

In operation 5130, the first amplifier 300b may compare the pixel signal PIX and the ramp signal RAMP based on the adjusted power current ISS1 and the adjusted bandwidth and may generate the first output signal OTA1_OUT based on a result of the comparison.

According to some embodiments of the present disclosure, a signal noise ratio (SNR) of a dual conversion gain operation may be optimized by adjusting a bandwidth of an amplifier in a low conversion gain operation and a bandwidth of the amplifier in a high conversion gain operation independently of each other.

Also, according to some embodiments of the present disclosure, power consumption of the dual conversion gain operation may be optimized by adjusting a power current of the amplifier in the low conversion gain operation and a power current of the amplifier in the high conversion gain operation independently of each other.

While the present disclosure has been described with reference to embodiments thereof, it will be apparent to those of ordinary skill in the art that various changes and modifications may be made thereto without departing from the spirit and scope of the present disclosure as set forth in the following claims.

It should also be noted that in some alternate implementations, the steps of the method of manufacturing or the steps of operations herein may occur out of the order. For example, two steps described in succession may in fact be executed substantially concurrently or the steps may sometimes be executed in the reverse order. Moreover, the steps of method or operation may be separated into multiple steps and/or may be at least partially integrated. Finally, other steps may be added/inserted between the steps that are illustrated, and/or the steps may be omitted without departing from the scope of the present invention.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. As used herein, the term "and/or" includes any and all combinations of one or more of the associated listed items. Moreover, the symbol "/" will be understood to be equivalent to the term "and/or."

It will be understood that when an element is "on" a surface, the surface may face the element.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and sub combinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents and shall not be restricted or limited by the foregoing detailed description.

What is claimed is:

1. An amplifier circuit, comprising:
   a first input terminal that is configured to receive a ramp signal;
   a second input terminal that is configured to receive a pixel signal;
   an output terminal that is configured to output an output signal, wherein the output signal is based on comparing the pixel signal and the ramp signal;
   a capacitor that is electrically connected between the output terminal and a ground terminal;
   a first switch that is electrically connected with the capacitor; and
   a current source that is configured to output a power current,
   wherein the pixel signal corresponds to a first conversion gain or a second conversion gain, and a value of the second conversion gain is higher than a value of the first conversion gain, and wherein a bandwidth of the amplifier circuit is adjusted depending on whether the pixel signal corresponds to the first conversion gain or the second conversion gain.

2. The amplifier circuit of claim 1, wherein, when the first switch is turned on, the capacitor decreases the bandwidth of the amplifier circuit.

3. The amplifier circuit of claim 2, wherein, when the pixel signal corresponds to the first conversion gain, the first switch is turned on or turned off in response to a first conversion gain enable signal, and wherein, when the pixel signal corresponds to the second conversion gain, the first switch is turned on or turned off in response to a second conversion gain enable signal.

4. The amplifier circuit of claim 3, wherein a time period during which the first conversion gain enable signal is maintained at a high signal level is different from a time period during which the second conversion gain enable signal is maintained at the high signal level.

5. The amplifier circuit of claim 1, wherein the bandwidth of the amplifier circuit when the pixel signal corresponds to the first conversion gain is lower than the bandwidth of the amplifier circuit when the pixel signal corresponds to the second conversion gain.

6. The amplifier circuit of claim 1, wherein a level of the power current is adjusted depending on whether the pixel signal corresponds to the first conversion gain or the second conversion gain.

7. The amplifier circuit of claim 6, wherein the current source includes:
a first current source that is configured to output a first sub-power current;
a second current source that is configured to output a second sub-power current; and
a second switch that is electrically connected with the second current source,
wherein, when the second switch is turned on, the power current is equal to a sum of the first sub-power current and the second sub-power current, and
wherein, when the second switch is turned off, the power current is equal to the first sub-power current.

8. The amplifier circuit of claim 7, wherein, when the pixel signal corresponds to the first conversion gain, the second switch is turned on or turned off in response to a first conversion gain enable signal, and
wherein, when the pixel signal corresponds to the second conversion gain, the second switch is turned on or turned off in response to a second conversion gain enable signal.

9. The amplifier circuit of claim 8, wherein a time period during which the first conversion gain enable signal is maintained at a high signal level is different from a time period during which the second conversion gain enable signal is maintained at the high signal level.

10. An image sensor comprising:
a pixel array including a plurality of pixels, wherein the pixel array is configured to output a first pixel signal that corresponds to a first conversion gain and a second pixel signal that corresponds to a second conversion gain from the plurality of pixels that share a floating diffusion region;
a first plurality of analog-to-digital converting (ADC) circuits, wherein each of the first plurality of ADC circuits is configured to output a first digital signal based on the first pixel signal and a first ramp signal; and a second plurality of ADC circuits, wherein each of the second plurality of ADC circuits is configured to output a second digital signal based on the second pixel signal and a second ramp signal,
wherein a value of the second conversion gain is higher than a value of the first conversion gain, and
wherein a first bandwidth of the first plurality of ADC circuits and a second bandwidth of the second plurality of ADC circuits are adjusted independently of each other.

11. The image sensor of claim 10, wherein the first bandwidth is less than the second bandwidth.

12. The image sensor of claim 10, wherein each of the first plurality of ADC circuits includes a first amplifier that is configured to generate a first output signal based on a result of comparing the first pixel signal and the first ramp signal,
wherein each of the second plurality of ADC circuits includes a second amplifier that is configured to generate a second output signal based on a result of comparing the second pixel signal and the second ramp signal, and
wherein the first bandwidth is determined depending on a bandwidth of the first amplifier, and the second bandwidth is determined depending on a bandwidth of the second amplifier.

13. The image sensor of claim 12, wherein each of the first amplifier and the second amplifier includes:
a capacitor that is electrically connected between an output terminal and a ground terminal; and
a first switch that is electrically connected with the capacitor, and
wherein, when the first switch of each of the first and second amplifiers is turned on, the capacitor of the first amplifier is configured to decrease the bandwidth of the first amplifier, and the capacitor of the second amplifier is configured to decrease the bandwidth of the second amplifier.

14. The image sensor of claim 13, wherein the first switch of the first amplifier is turned on or turned off in response to a first conversion gain enable signal, and the first switch of the second amplifier is turned on or turned off in response to a second conversion gain enable signal, and
wherein a time period during which the first conversion gain enable signal is maintained at a high signal level is different from a time period during which the second conversion gain enable signal is maintained at the high signal level.

15. The image sensor of claim 12, wherein the first amplifier operates based on a first power current, and the second amplifier operates based on a second power current,
wherein each of the first amplifier and the second amplifier includes:
a first current source that is configured to output a first sub-power current;
a second current source that is configured to output a second sub-power current; and
a second switch that is electrically connected with the second current source, and
wherein, when the second switch is turned on, each of the first power current and the second power current is equal to a sum of the first sub-power current and the second sub-power current, and
wherein, when the second switch is turned off, each of the first power current and the second power current is equal to the first sub-power current.

16. The image sensor of claim 15, wherein the second switch of the first amplifier is turned on or turned off in response to a first conversion gain enable signal, and the second switch of the second amplifier is turned on or turned off in response to a second conversion gain enable signal, and wherein a time period during which the first conversion gain enable signal is maintained at a high signal level is different from a time period during which the second conversion gain enable signal is maintained at the high signal level.

17. An operation method of an analog-to-digital converting (ADC) circuit, comprising:

generating an output signal from an amplifier of the ADC circuit, wherein the output signal is based on a result of comparing a pixel signal and a ramp signal;

adjusting a power current of the amplifier depending on a conversion gain of the pixel signal; and adjusting a bandwidth of the amplifier depending on the conversion gain of the pixel signal, wherein the output signal is further based on the power current.

18. The operation method of claim 17, wherein the amplifier includes a capacitor that is electrically connected between an output terminal and a ground terminal and a switch that is electrically connected with the capacitor, and wherein adjusting the bandwidth of the amplifier includes:

controlling the capacitor to decrease the bandwidth by turning on the switch.

19. The operation method of claim 17, wherein the amplifier includes a first current source that outputs a first sub-power current, a second current source that outputs a second sub-power current, and a switch that is electrically connected with the second current source, wherein adjusting the power current includes:

adjusting the power current to be a sum of the first sub-power current and the second sub-power current by turning on the switch; and adjusting the power current to be the first sub-power current by turning off the switch.

20. The operation method of claim 17, wherein adjusting the power current includes:

increasing the power current when the conversion gain of the pixel signal increases, and wherein adjusting the bandwidth of the amplifier includes:

increasing the bandwidth of the amplifier when the conversion gain of the pixel signal increases.

* * * * *